(12) United States Patent
Li et al.

(10) Patent No.: US 9,892,928 B2
(45) Date of Patent: Feb. 13, 2018

(54) ELECTRICALLY ERASABLE PROGRAMMABLE NON-VOLATILE MEMORY CELL STRUCTURE

(71) Applicant: eMemory Technology Inc., Hsin-Chu (TW)

(72) Inventors: Chun-Hsiao Li, Hsinchu County (TW); Wei-Ren Chen, Pingtung County (TW); Wen-Hao Lee, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 14/989,801

(22) Filed: Jan. 7, 2016

(65) Prior Publication Data

US 2016/0197089 A1    Jul. 7, 2016

Related U.S. Application Data

(60) Provisional application No. 62/100,488, filed on Jan. 7, 2015.

(51) Int. Cl.
| | |
|---|---|
| *H01L 29/788* | (2006.01) |
| *H01L 21/28* | (2006.01) |
| *H01L 29/423* | (2006.01) |
| *H01L 27/11558* | (2017.01) |

(52) U.S. Cl.
CPC .. *H01L 21/28273* (2013.01); *H01L 27/11558* (2013.01); *H01L 29/42328* (2013.01); *H01L 29/7883* (2013.01)

(58) Field of Classification Search
CPC ......... H01L 21/28273; H01L 27/11558; H01L 29/7883; H01L 29/42328
USPC ........................................................ 257/315
See application file for complete search history.

(56) References Cited

U.S. PATENT DOCUMENTS

| | | | |
|---|---|---|---|
| 6,274,898 B1 * | 8/2001 | Mehta | G11C 16/0441 257/295 |
| 8,658,495 B2 | 2/2014 | Hsu | |
| 8,941,167 B2 | 1/2015 | Chen | |
| 9,099,392 B2 | 8/2015 | Hsu | |
| 2002/0074583 A1 * | 6/2002 | Sugiyama | H01L 21/28273 257/298 |
| 2010/0032744 A1 * | 2/2010 | Mitros | H01L 29/0692 257/316 |

(Continued)

*Primary Examiner* — Dale E. Page
*Assistant Examiner* — Wilner Jean Baptiste
(74) *Attorney, Agent, or Firm* — Winston Hsu

(57) ABSTRACT

A NVM cell structure includes a semiconductor substrate having a first conductivity type, a first well region having a second conductivity type, a floating gate transistor and an erase gate region. The first well region is disposed on a first OD region of the semiconductor substrate. The erase gate region disposed on a second OD region of the semiconductor substrate includes a first doped region and at least one second doped region having the second conductivity type. The first doped region is disposed in semiconductor substrate and covers the second OD region, and the second doped region is disposed in the first doped region. The first doped region encompasses the second doped region, and a doping concentration of the second doped region is larger than a doping concentration of the first doped region.

14 Claims, 14 Drawing Sheets

(56) References Cited

U.S. PATENT DOCUMENTS

2010/0329016 A1* 12/2010 Taniguchi .......... G11C 16/0433
365/185.18
2015/0187782 A1* 7/2015 Yamakoshi ........ G11C 16/0441
257/321

* cited by examiner

ELECTRICALLY ERASABLE PROGRAMMABLE NON-VOLATILE MEMORY CELL STRUCTURE

CROSS REFERENCE TO RELATED APPLICATIONS

This application claims the benefit of U.S. provisional application No. 62/100,488 filed Jan. 7, 2015.

BACKGROUND OF THE INVENTION

1. Field of the Invention

The present invention relates to a non-volatile memory (NVM) cell structure, a NVM array structure and a method of fabricating a NVM cell structure, and more particularly, to an electrically erasable programmable (EEP) NVM cell structure and an EEP NVM array structure and a method of fabricating the EEP NVM cell structure.

2. Description of the Prior Art

Non-volatile memory (NVM) is a type of memory that retains information it stores even when no power is supplied to memory blocks thereof. Some examples include magnetic devices, optical discs, flash memory, and other semiconductor-based memory topologies.

For example, U.S. Pat. No. 6,678,190 discloses a single-poly NVM having two serially connected PMOS transistors wherein the control gate is omitted in the structure for layout as the bias is not necessary to apply to the floating gate during the programming mode. A first PMOS transistor acts as a select transistor. A second PMOS transistor is connected to the first PMOS transistor. A gate of the second PMOS transistor serves as a floating gate. The floating gate is selectively programmed or erased to store predetermined charges. However, the electrical erase fails to be utilized to remove the electric charges in the floating gate. That is, for achieving the data-erasing function, the electric charges stored in the floating gate should be removed from the floating gate by exposing ultraviolet (UV) light to the NVM. These NVMs are named as one time programming (OTP) memories. Accordingly, the need exists for multi-times programming (MTP) memories design.

SUMMARY OF THE INVENTION

It is therefore one of the objectives of the present invention to provide a non-volatile memory (NVM) cell structure, a NVM array structure and a method of fabricating a NVM cell structure to solve the drawbacks encountered in the prior art.

According to an embodiment, a NVM cell structure is provided. The NVM cell structure includes a semiconductor substrate, a first well region, a floating gate transistor and an erase gate region. The semiconductor substrate has a first conductivity type, and the substrate has a first oxide define (OD) region and a second OD region separated from each other. The first well region is disposed in the first OD region of the semiconductor substrate, wherein the first well region has a second conductivity type. The floating gate transistor is disposed on the first OD region, wherein the floating gate transistor includes a floating gate and a floating gate dielectric layer disposed between the floating gate and the first OD region, and the floating gate includes a first part overlapping the first OD region and a second part overlapping the second OD region. The erase gate region is disposed on the second OD region, wherein the erase gate region includes a first doped region disposed in the second OD region and covering the second OD region, at least one second doped region disposed in the first doped region, and an erase gate dielectric layer between the first doped region and the floating gate, and the first doped region encompasses the second doped region, wherein the first doped region and the second doped regions have the second conductivity type, and a doping concentration of each second doped region is larger than a doping concentration of the first doped region.

According to another embodiment, a NVM array structure is provided. The NVM array structure includes a semiconductor substrate, two first well regions, at least two floating gate transistors and an erase gate region. The semiconductor substrate has a first conductivity type, and the semiconductor substrate has at least two first OD region and a second OD region separated from one another, wherein the second OD region extends along a direction, and the at least two first OD regions are located at two sides of the second OD region respectively. The first well regions are disposed in the at least two first OD regions of the semiconductor substrate respectively, wherein each first well region has a second conductivity type complementary to the first conductivity type. The floating gate transistors are disposed on the at least two first OD regions respectively, wherein each first floating gate transistor includes a floating gate, and each floating gate overlapping each first OD region and the second OD region. The erase gate region is disposed on the second OD region, wherein the erase gate region includes at least three second doped regions arranged along the direction, each second doped region and each floating gate are sequentially arranged along the direction alternately, and each second doped region has the second conductivity type.

According to still another embodiment, a method of fabricating a non-volatile memory cell structure is provided. First, a substrate structure including a semiconductor substrate having a first conductivity type, an isolation structure disposed in the semiconductor substrate, and a first well region having a second conductivity type is provided, wherein the semiconductor substrate has a first OD region and a second OD region separated from each other. Next, a first doped region is formed in the second OD region of the semiconductor substrate, and the first doped region covers the second OD region, wherein the first doped region has the second conductivity type. Then, a dielectric layer is formed to cover the first OD region and the second OD region and followed by forming a floating gate on the dielectric layer. Subsequently, at least one second doped regions are formed in the first doped region, wherein the first doped region encompasses the second doped region, the second doped region has the second conductivity type, and a doping concentration of the second doped region is larger than a doping concentration of the first doped region.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
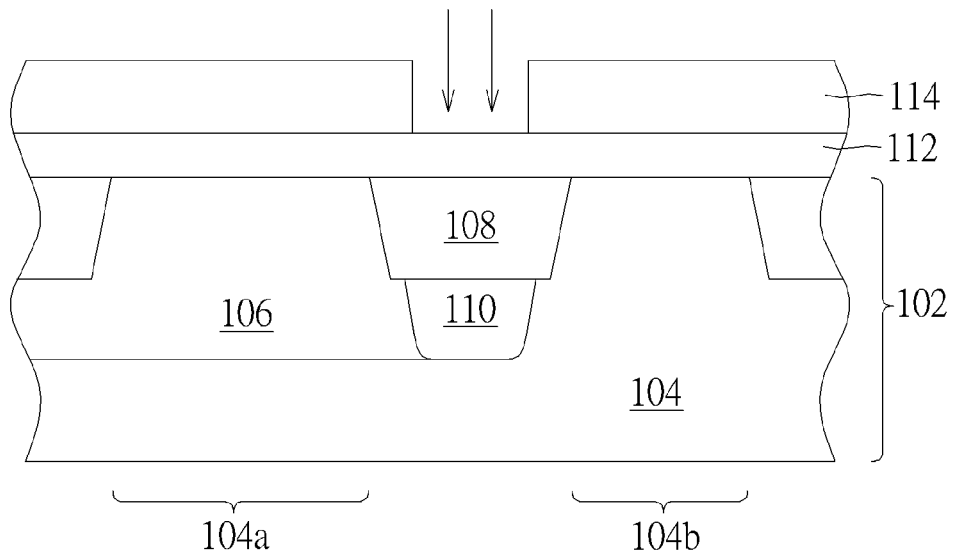
FIGS. 1-7 are schematic diagrams illustrating a method of fabricating a non-volatile memory (NVM) cell structure according to a first embodiment of the present invention.

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art. Other embodiments may be utilized and structural, logical, and electrical changes may be made without departing from the scope of the present invention.

Likewise, the drawings showing embodiments of the apparatus are semi-diagrammatic and not to scale and some dimensions are exaggerated in the figures for clarity of presentation. Also, where multiple embodiments are disclosed and described as having some features in common, like or similar features will usually be described with like reference numerals for ease of illustration and description thereof.

For the purposes of the present invention, The term "oxide define (OD) region" ("OD" region is sometimes referred to as "oxide defined" region or "oxide definition" region) is commonly known in this technical field to be defined as a region on a silicon main surface of a substrate other than a local oxidation of silicon (LOCOS) or a shallow trench isolation (STI) region. The term "oxide define (OD) region" is also commonly referred to as an "active area" where the active circuit elements such as transistors are formed and operated.

Figure 3:
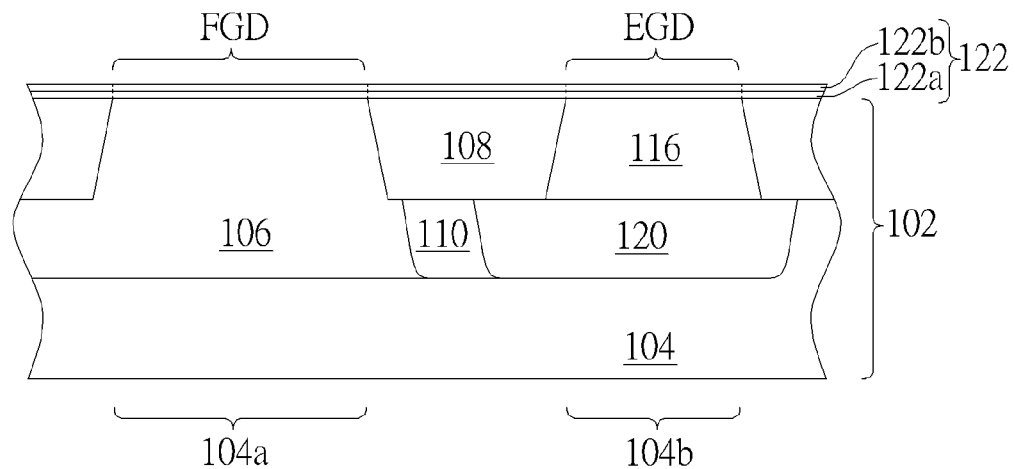
Figure 4:
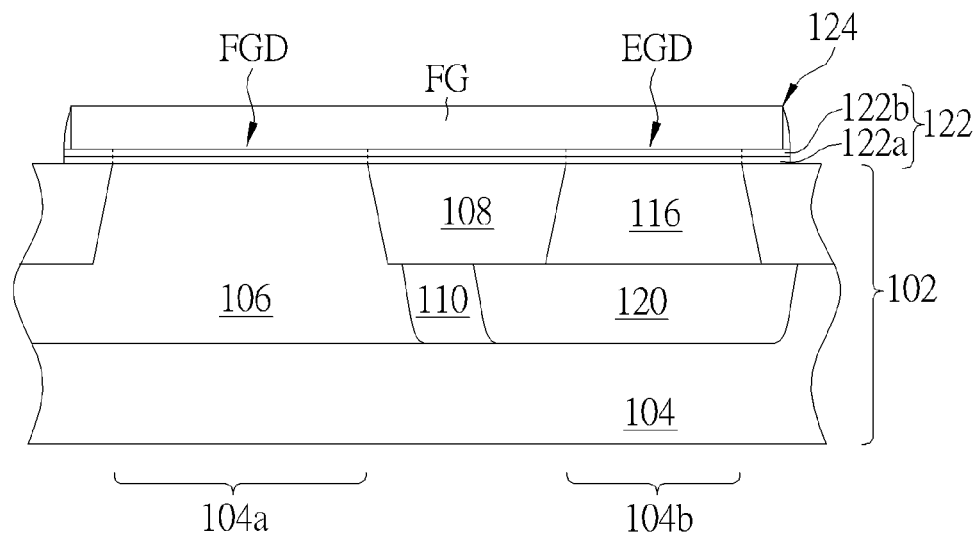
Figure 5:
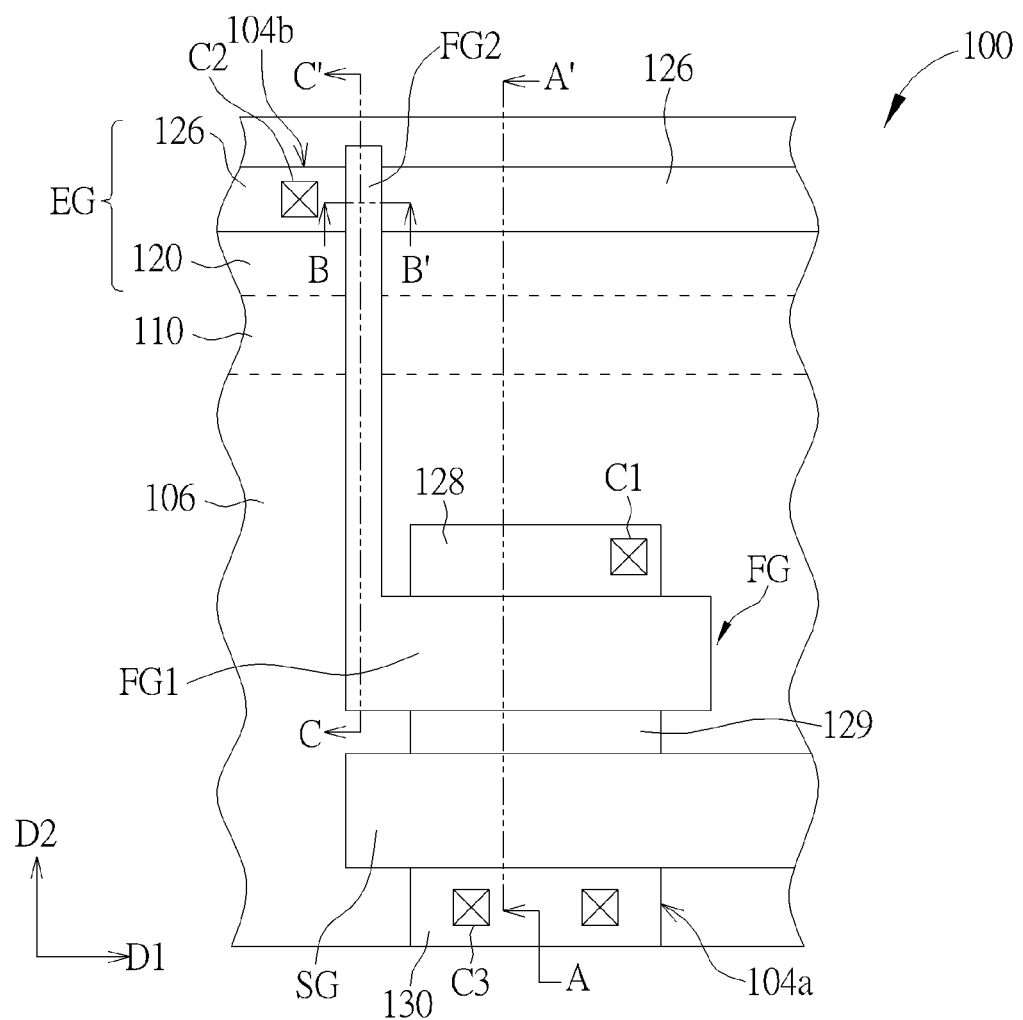
Figure 6:
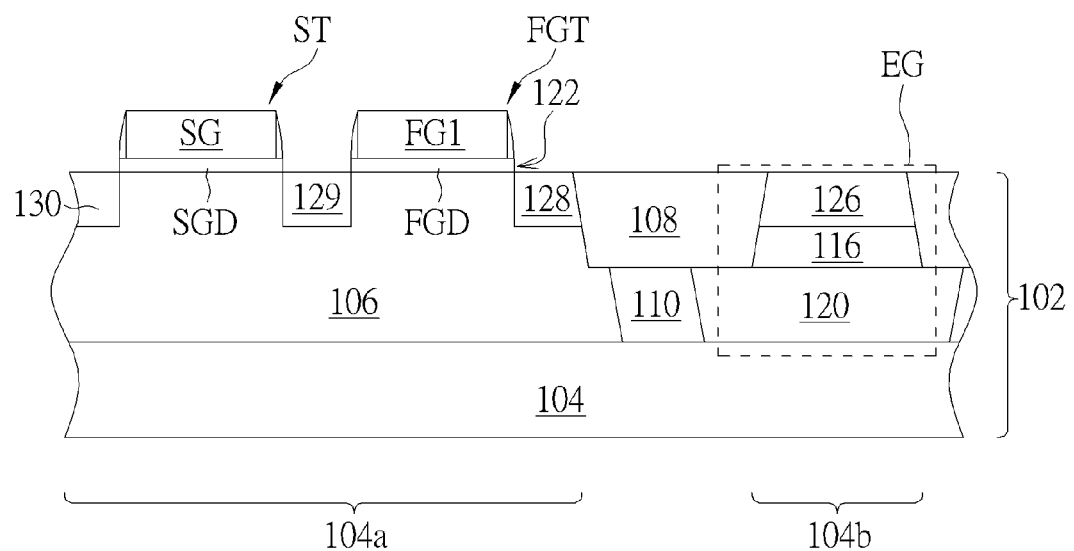
Figure 7:
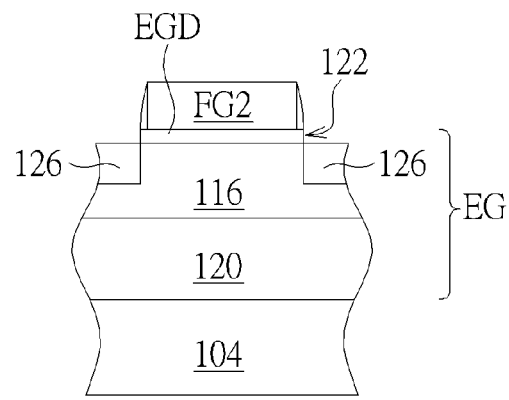

FIGS. 1-7 are schematic diagrams illustrating a method of fabricating a non-volatile memory (NVM) cell structure according to a first embodiment of the present invention, in which FIG. 5 is a schematic diagram illustrating a plan view of the NVM cell structure in accordance with the first embodiment of the present invention, FIG. 6 schematically illustrates a cross-sectional view taken along a cross-sectional line A-A' of FIG. 5, and FIG. 7 schematically illustrates a cross-sectional view taken along a cross-sectional line B-B' of FIG. 1. As shown in FIG. 1, a substrate structure 102 including a semiconductor substrate 104, a first well region 106, and an isolation structure 108 is first provided. The semiconductor substrate 104 having a first conductivity type has a first oxide define (OD) region 104a and a second OD region 104b. Specifically, the isolation structure 108 defining the first OD region 104a and the second OD region 104b. For example, the isolation structure 108 may be shallow trench isolation (STI) or field oxide (FOX). The first well region 106 having a second conductivity type complementary to the first conductivity type is disposed in the first OD region 104a of the semiconductor substrate 104. In this embodiment, the first well region 106 may be formed before the formation of the isolation structure 108, but the present invention is not limited thereto. In another embodiment, the isolation structure 108 may be formed before the formation of the first well region 106. Also, the first conductivity type and the second conductivity type of this embodiment may be p-type and n-type respectively, but not limited herein. In another embodiment, the first conductivity type and the second conductivity type may be n-type and p-type respectively.

In this embodiment, an intermediate well region 110 is selectively formed in the semiconductor substrate 104 under the isolation structure 108 and between the first OD region 104a and the second OD region 104b after the isolation structure 108 is provided. Specifically, a sacrificial layer 112, such as an oxide layer, is formed on the semiconductor substrate 104, and then, a patterned photoresist layer 114 may be formed on the semiconductor substrate 104. After that, an ion implantation process of the first conductivity type using the patterned photoresist layer 114 as a mask and a thermal drive-in process are performed to form the intermediate well region 110. The intermediate well region 110 may be in contact with the first well region 106, and the bottom of the intermediate well region 110 and the bottom of the first well region 106 may be disposed in the same level or in different levels. A doping concentration of the intermediate well region 110 is larger than a doping concentration of the semiconductor substrate 104. Furthermore, the semiconductor substrate 104 may have a core device region used for forming core devices, such as internal circuit, and an input/output (I/O) device region used for forming I/O devices, and the NVM cell structure 100 of this embodiment is formed in the I/O device region, but not limited thereto. Accordingly, the first well region 106 may be formed with any one well region of the second conductivity type in the core device region and the I/O device region, and the intermediate well region 110 may be formed with any one well region of the first conductivity type in the core device region and the I/O device region, but not limited herein.

Figure 2:
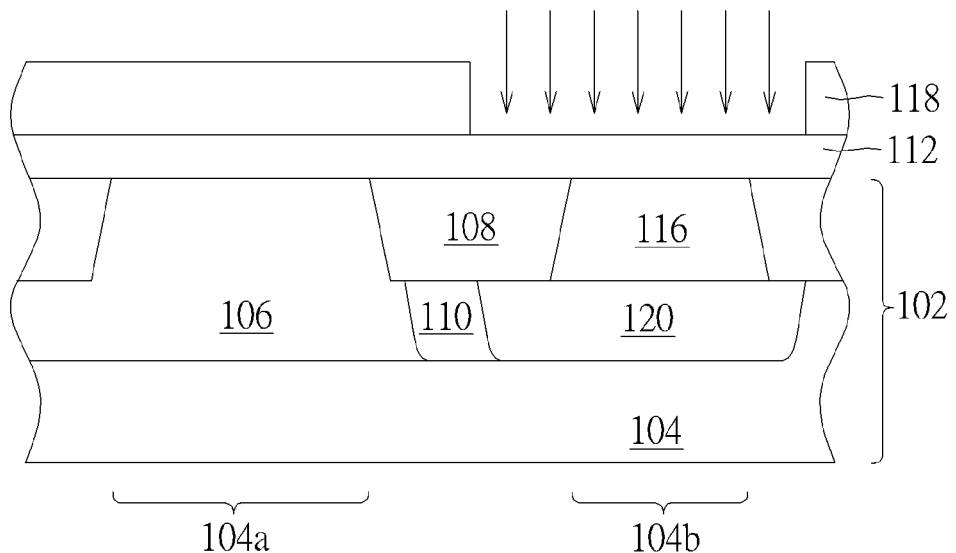

As shown in FIG. 2, a first doped region 116 having the second conductivity type is formed in the second OD region 104b of the semiconductor substrate 104 after the formation of the intermediate well region 110, and the first doped region 116 covers the second OD region 104b. Namely, the patterned photoresist layer 114 is removed after the formation of the intermediate well region 110 and followed by forming another patterned photoresist layer 118 on the sacrificial layer 112 by using an extra photomask. The patterned photoresist layer 118 has an opening corresponding to the second OD region 104b. Then, another ion implantation process of the second conductivity type using the patterned photoresist layer 118 as a mask and another thermal drive-in process are performed to form the first doped region 116 in the second OD region 104b.

After the first doped region 116 is formed, a second well region 120 having the first conductivity type is selectively formed in the semiconductor substrate 104 under the first doped region 116. Specifically, the second well region 120 may be formed by performing another ion implantation process of the first conductivity type using the same patterned photoresist layer 118 as a mask and another thermal drive-in process. In this embodiment, a top of the second well region 120 is in direct contact with the first doped region 116, and the doping concentration of the second well region 120 is larger than the doping concentration of the semiconductor substrate 104, thereby forming a PN junction to increase junction breakdown voltage of the NVM cell structure 100 in the erasing operation. Preferably, a side of the second well region 120 is in direct contact with the intermediate well region 110, and the doping concentration of the intermediate well region 110 is larger than the doping concentration of the second well region 120.

As shown in FIG. 3, the patterned photoresist layer 118 and the sacrificial layer 112 are removed sequentially, and followed by forming a dielectric layer 122 on the semiconductor substrate 104. In this embodiment, the dielectric layer 122 may include a floating gate dielectric layer FGD on the first OD region 104a and an erase gate dielectric layer EGD on the second OD region 104b, but the present invention is not limited thereto. For example, the dielectric layer 112 may be formed by a chemical vapor deposition (CVD) process and to cover the semiconductor substrate 104 and the isolation structure 108, and a material of the dielectric layer includes, but not limited to, silicon oxide. In another embodiment, the dielectric layer 112 may be formed by performing a thermal oxidation process, such that the first OD region 104a and the second OD region 104b of the semiconductor substrate 104 are oxidized to form the floating gate dielectric layer FGD on the first OD region 104a and the erase gate dielectric layer EGD on the second OD region 104b, but the present invention is not limited thereto. Since the floating gate dielectric layer FGD and the erase gate dielectric layer EGD are formed simultaneously, the thickness of the floating gate dielectric layer FGD and the thickness of the erase gate dielectric layer EGD may be the same.

Furthermore, the dielectric layer 122 may be formed of a single dielectric layer or a stack of two dielectric layers, such as an I/O dielectric layer 122a and a core dielectric layer 122b. For example, when the dielectric layer 122 is formed of a stack of two dielectric layers, the I/O dielectric layer 122a is formed to cover the I/O device region including the first OD region 104a and the second OD region 104b and the core device region and followed by removing the I/O dielectric layer 122a in the core device region. The core dielectric layer 122b is then formed on the I/O dielectric layer 122a to cover the I/O device region and the core device region, thereby forming the dielectric layer 122 in the I/O device region.

As shown in FIG. 4, subsequently, a gate structure 124 is formed on the dielectric layer 122. The gate structure 124 may include a poly gate that may be a single layer of polysilicon or doped polysilicon, and a spacer surrounding the poly gate. In this embodiment, the step of forming the poly gate includes forming a floating gate FG on the first OD region 104a and the second OD region 104b and a select gate SG on the first OD region 104a. Specifically, the floating gate FG overlaps both the floating gate dielectric layer FGD and the erase gate dielectric layer EGD, and the select gate SG is disposed on a select gate dielectric layer SGD which is a part of the dielectric layer 122.

Since FIG. 4 cannot show the following steps, please refer to FIGS. 5-7. After the poly gate 124 is formed, another ion implantation process of the second conductivity type using the floating gate FG as a part of the mask and another drive-in process may be performed to form at least one second doped region 126 having the second conductivity type in the first doped region 116, and another ion implantation process of the first conductivity type using the floating gate FG and the select gate SG as apart of the mask and another drive-in process may be performed to form a third doped region 128 having the first conductivity type, a fourth doped region 129 having the first conductivity type and a fifth doped region 130 having the first conductivity type in the first well region 106. An erase gate region EG including the first doped region 116, the second doped region 126, the second well region 120 and the erase gate dielectric layer EGD, a floating gate transistor FGT including the floating gate FG, the floating gate dielectric layer FGD, the third doped region 128 and the fourth doped region 129, and a select transistor ST including the select gate SG, the select gate dielectric layer SGD, the fourth doped region 129 and the fifth doped region 130 are accordingly formed, thereby forming the NVM cell structure 100 of this embodiment that is a single-poly NVM cell structure. In another embodiment, the sequence of the ion implantation processes of the first conductivity type and the second conductivity type may be exchanged. It is worthy noted that since the steps of forming the first well region 106, the intermediate well region 110, the second doped region 126, the third doped region 128, the fourth doped region 129 and the fifth doped region 130 can be compatible with the CMOS process, the method of fabricating the NVM cell structure 100 only require the extra photomask and two ion implantation processes to form the first doped region 116 and the second well region 120. Thus, the method of this embodiment is easy to compatible with the traditional semiconductor process and can be widely used in different applications.

Referring to FIGS. 4-7, the NVM cell structure 100 provided by this embodiment is further detailed in the following description, wherein FIG. 4 shows a cross-sectional view taken along a cross-sectional line C-C' of FIG. 5. The NVM cell structure 100 includes the semiconductor substrate 104 having the first OD region 104a and the second OD region 104b thereon, the first well region 106, the floating gate transistor FGT on the first OD region 104a and the erase gate region EG on the second OD region 104b. In this embodiment, the first OD region 104a and the second OD region 104b are defined and surrounded by the isolation structure 108. Further, the second OD region 104b extends along a first direction D1, and the first OD region 104a extends along a second direction D2 different from the first direction D1. For example, the first direction D1 and the second direction D2 are substantially perpendicular to each other, but not limited thereto. Also, the first well region 106 covers the first OD region 104a and extends to be under a part of the isolation structure 108.

In the floating gate transistor FGT, the floating gate dielectric layer FGD is disposed between the floating gate FG and the first well region 106, the third doped region 128 and the fourth doped region 129 are disposed in the first well region 106 at two sides of the floating gate FG. Accordingly, a part of the first well region 106 disposed between the third doped region 128 and the fourth doped region 129 serves as a channel region of the floating gate transistor FGT. The third doped region 128 is electrically connected to a bit line BL through a contact plug C1 and applied with a bit line voltage $V_{BL}$. Furthermore, the floating gate FG of the floating gate transistor FGT extends from the first OD region 104a onto the second OD region 104b such that the floating gate FG includes a first part FG1 overlapping the first OD region 104a and a second part FG2 overlapping the second OD region 104b, and the floating gate FG overlaps the erase region EG. Specifically, the erase gate region EG includes two second doped regions 126 in the second OD region 104b at two sides of the second part FG2 of the floating gate FG, and the second doped regions 126, the erase gate dielectric layer EGD and the floating gate FG form an erase capacitor that is also called metal-oxide-semiconductor (MOS) field effect transistor (FET) capacitor. The extension direction of the first part FG1 of the floating gate FG is substantially perpendicular to the extension direction of the second part FG2 of the floating gate FG, and the first part FG1 and the second part FG2 forms the L-shaped floating gate FG. In another embodiment, the extension direction of the first part FG1 may be substantially parallel to the extension direction of the second part FG2. Besides, the first part FG1 of the floating gate FG of this embodiment crosses the first doped region 116, and thus, the second doped regions 126 are spaced apart from each other because the second doped regions 126 are formed by using the floating gate FG as the mask. Also, an overlapping area between the floating gate FG and the first OD region 104a may be larger than an overlapping area between the floating gate FG and the second OD region 104b.

In erase gate region EG, one of the second doped regions 126 is electrically connected to an erase line EL through a contact plug C2 and applied with an erase line voltage $V_{EL}$ through the erase line EL. Since the first doped region 116 is disposed between the two separated second doped regions 126 and connects them, the second doped regions 126 are easy to be conducted to have the erase line voltage $V_{EL}$, especially the other one of the second doped regions 126 that is not directly connected to the erase line EL can have the erase line voltage $V_{EL}$. Accordingly, the electric charges Q in the floating gate FG can be easily erased, and the erase line voltage $V_{EL}$ can be decreased in the erasing operation. The first doped region 116 is further disposed between the second doped regions 126 and the second well region 120 and separates them, so that a PN junction is formed. Also, since a doping concentration of each second doped region 126 is larger than a doping concentration of the first doped region 116, and a doping concentration of the second well region 120 contacting the first doped region 116 is larger than a doping concentration of the semiconductor substrate 104, the PN junction formed of the first doped region 116 and the second well region 120 can be stronger than the PN junction formed of the second doped region 126 and the semiconductor substrate 104. The stronger PN junction may be formed between the erase capacitor and the first well region 106 coupled to the channel region of the floating gate transistor FGT, and the junction breakdown voltage between the second doped regions 126 and the first well region 106 can be increased while applying a large voltage difference between the second doped regions 126 and the first well region 106 in the erasing operation, thereby increasing cycling times of the programming operations and the erasing operations and a lifetime of the NVM cell structure 100. The vertical junction breakdown the second doped regions 126 and the first well region 106 is not easily generated. Further, since a doping concentration of the intermediate well region 110 is larger than a doping concentration of the second well region 120, a PN junction formed between the first well region 106 and the intermediate well region 110 can be used to withstand the program voltage and avoid horizontal junction breakdown between the first well region 106 and the erase gate region EG during the programming operation.

In this embodiment, the NVM cell structure 100 further includes the select transistor ST disposed on the first OD region 104a. The select transistor ST is electrically connected to the floating gate transistor FGT through the fourth doped region 129 adjacent to the select gate SG. Specifically, the select transistor ST and the floating gate transistor FGT share the fourth doped region 129 adjacent to the select gate SG, and the fourth doped region 129 and the fifth doped region 130 are disposed at two sides of the select gate SG, such that the fourth doped region 129 serves as the drain of the select transistor ST, and the fifth doped region 130 serves as the source of the select transistor ST. The fifth doped region 130 is electrically connected to a source line SL through at least one contact plug C3 and applied with a source line voltage $V_{SL}$, and the source line SL is electrically connected to the first well region 106. The select gate SG is electrically connected to a word line WL and applied with a word line voltage $V_{WL}$.

Figure 8:
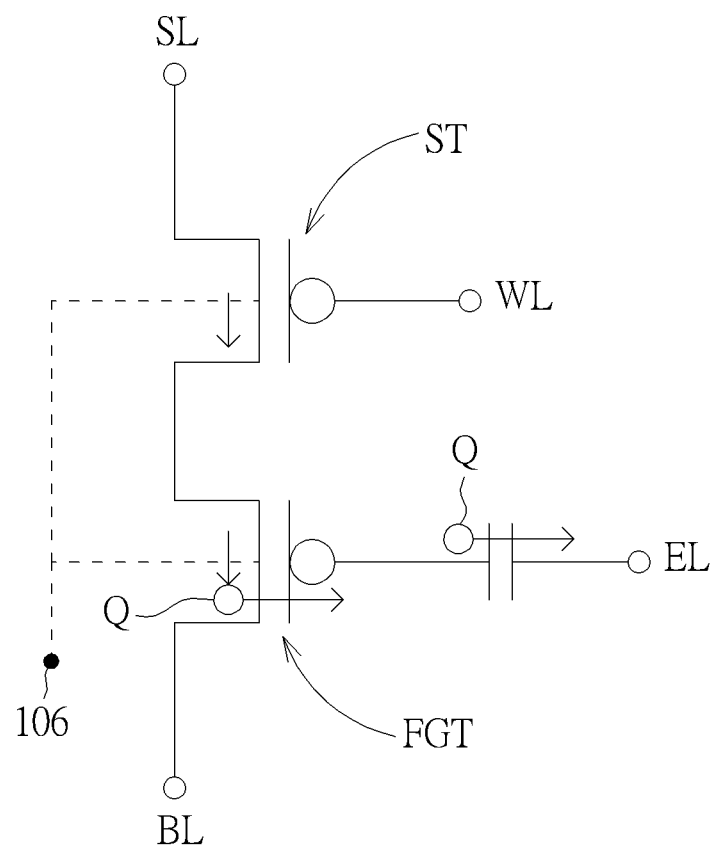
FIG. 8 is a schematic diagram illustrating an equivalent circuit of the NVM cell structure according to the present invention.

Referring to FIG. 8 and TABLE 1 with FIGS. 5-7, FIG. 8 is a schematic diagram illustrating an equivalent circuit of the NVM cell structure according to the present invention, and TABLE 1 lists exemplary conductions for a programming operation, a reading operation, and an erasing operation. When the NVM cell structure 100 is operated in a programming operation, the bit line BL and the intermediate well region 110 are grounded such that the bit line voltage $V_{BL}$ and an intermediate well voltage $V_{IM}$ applying to the intermediate well region 110 are 0 volt (V); the source line voltage $V_{SL}$ and a first well voltage $V_1$ applying to the first well region 106 are program voltage Vp larger than 0 V; the word line voltage $V_{WL}$ is ranged between 0 to 3Vp/4, preferably Vp/2; and the erase line voltage $V_{EL}$ is ranged between 0 to the program voltage Vp. Accordingly, the select transistor ST is turned on, and the program voltage is applied to the fifth doped region 130. Through channel hot electron (CHE) injection mechanism, the electric charges Q can be injected into the floating gate FG to perform the programming operation. For example, the program voltage Vp is ranged from 5.5 V to 9 V, preferably 7 V. When the NVM cell structure 100 is operated in an erasing operation, the bit line BL, the source line SL, the word line WL, the first well region 106 and the intermediate well region 110 are grounded, such that the bit line voltage $V_{BL}$, the source line voltage $V_{SL}$, the word line voltage $V_{WL}$, the first well voltage $V_1$ and the intermediate well voltage $V_{IM}$ are 0 V, and the erase line voltage $V_{EL}$ is an erase voltage Ve ranged from 9 V to 18 V. Through the voltage difference between the second doped regions 126 and the first well region 106, the electric charges Q in the floating gate FG can tunnel into the second doped regions 126 with Fowler-Nordheim (FN) tunneling mechanism, thereby erasing the electric charges Q in the floating gate FG. When the NVM cell structure 100 is operated in a reading operation, the source line voltage $V_{SL}$ and the first well voltage $V_1$ are read voltage Vr ranged from 1.2 V to 3.3 V, preferably 2.0 V or 2.6 V and the bit line BL, the word line WL, the erase line EL and the intermediate well region 110 are grounded, such that the bit line voltage $V_{BL}$, the word line voltage $V_{WL}$, the erase line voltage $V_{EL}$ and the intermediate well voltage $V_{IM}$ are 0 V. According to the above operation modes, the electric charges Q can be electrically programmed to the floating gate and electrically erased from the floating gate. Accordingly, the NVM cell structure of this embodiment can be may be a multi-time programmable (MTP) memory.

TABLE 1

|  | $V_{BL}$ | $V_{SL}$ | $V_{WL}$ | $V_1$ | $V_{EL}$ | $V_{IM}$ |
|---|---|---|---|---|---|---|
| programming operation | 0 | Vp | 0~3Vp/4 | Vp | 0~Vp | 0 |
| erasing operation | 0 | 0 | 0 | 0 | Ve | 0 |
| reading operation | 0 | Vr | 0 | Vr | 0 | 0 |

Figure 9:
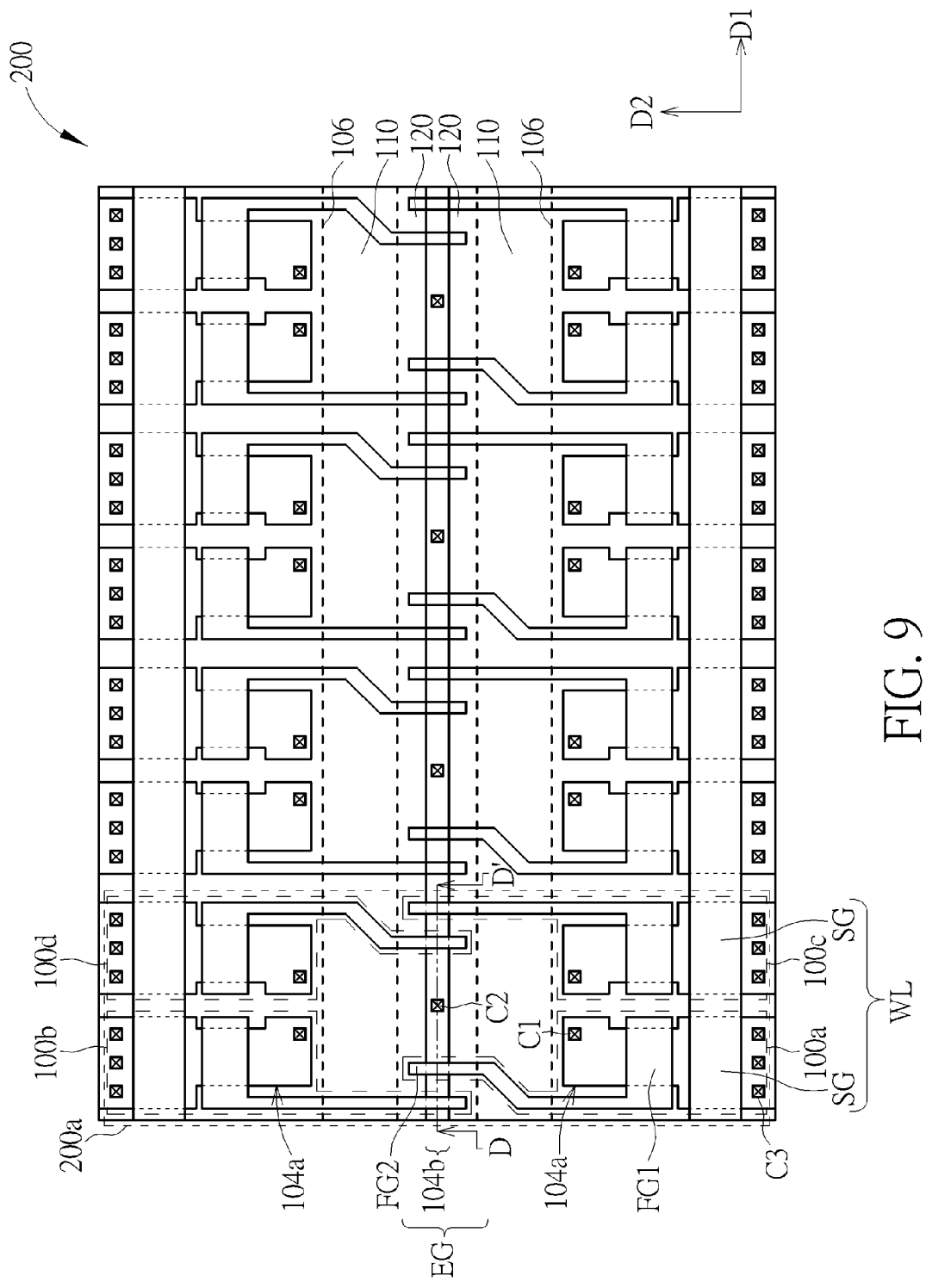
FIG. 9 is a schematic diagram illustrating a plan view of the NVM array structure according to the first embodiment of the present invention.
Figure 10:
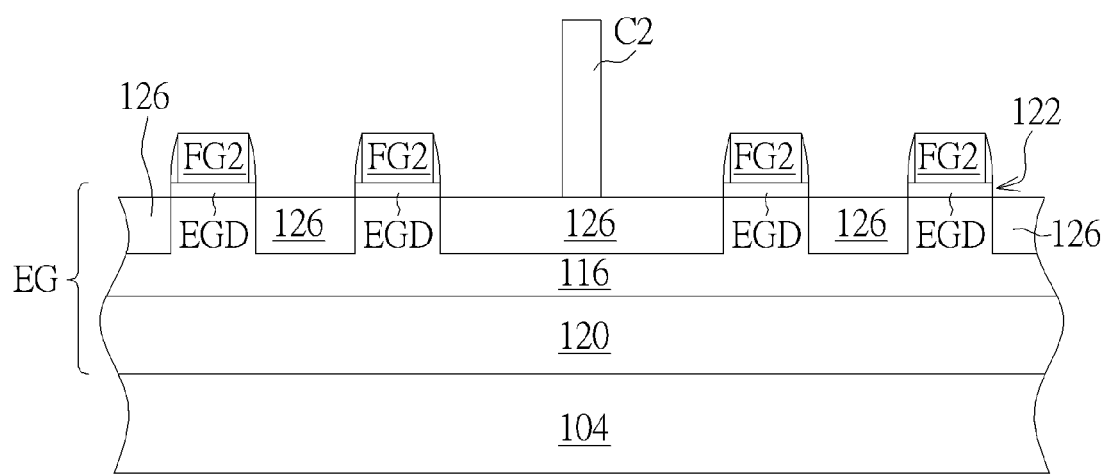
FIG. 10 is a cross-sectional view taken along a cross-sectional line of FIG. 9.

According to the above-mentioned NVM cell structure 100, a NVM array structure is also provided in the present invention. Referring to FIGS. 9 and 10, FIG. 9 is a schematic diagram illustrating a plan view of the NVM array structure according to the first embodiment of the present invention, and FIG. 10 is a cross-sectional view taken along a cross-sectional line D-D' of FIG. 9. As shown in FIGS. 9 and 10, the NVM array structure 200 includes at least two NVM cell structures 100 of the first embodiment on the semiconductor substrate 104. Also, the second OD regions 104b of the NVM cell structures 100 are connected in series and form a single second OD region 104b, and the erase gate regions EG of the NVM cell structures 100 are connected in series and form a single erase gate region EG. Thus, the first doped regions 116 and the second well regions 126 are also connected to form single first doped region 116 and the single second well region 126 respectively. In order to achieve the performance of the first embodiment, the first doped region 116 cover the second OD region 104b, and the second well region 126 is disposed under the first doped region 116. Besides the second OD region 104b, the semiconductor substrate 104 further has at least two first OD regions 104a separated from one another, wherein the second OD region 104b extends along a first direction D1, and the first OD regions 104a are located at a first side and a second side of the second OD region 104b opposite to each other respectively. For instance, the first OD regions 104a can be symmetrical to each other with respect to the second OD region 104b. The NVM array structure 200 may further include two first well regions 106 disposed in the first OD regions 104a of the semiconductor substrate 104 respectively. The first well regions 106 may be symmetrical to each other with respect to the second OD region 104b. Each floating gate transistor FGT in each NVM cell structure 100 is respectively disposed on each first OD region 104a. Each floating gate transistor FGT includes a floating gate FG overlapping each first OD region 104a and extending to overlap the second OD region 104b. Also, the erase gate region EG includes at least three second doped regions 126 arranged along the first direction D1, and each second doped region 126 and each floating gate FG are sequentially arranged along the first direction D1 alternately.

In this embodiment, the NVM array structure 200 may include a plurality of NVM cell structures 100 arranged in an array formation. Two rows of the NVM cell structures are taken as an example in the following description, but not limited thereto. Specifically, the semiconductor substrate 104 has a plurality of the first OD regions 104a separated from one another and disposed at the first and second sides of the second OD region 104b respectively. Each floating gate transistor FGT is disposed on each first OD region 104a respectively, and each select transistor ST is disposed on each first OD region 104a respectively. The erase gate region EG includes a plurality of second doped regions 126.

Also, each floating gate FG crosses the second OD region 104b, so that one of the second parts FG2 of the floating gates FG of any two of the erase capacitors disposed at two sides of the second OD region 104b and corresponding to each other has a zigzag part overlapping the second OD region 104b as shown in FIG. 9.

For example, four NVM cell structures 100 may form a repeated unit 200a and may be divided into first, second, third and fourth NVM cell structures 100a, 100b, 100c, 100d. The first and second NVM cell structures 100a, 100b are arranged along the second direction D2, and the third and fourth NVM cell structures 100c, 100d are also arranged along the second direction D2. In order to prevent the floating gates FG of the first and second NVM cell structures 100a, 100b or the third and fourth NVM cell structures 100c, 100d from contacting each other, the second part FG2 of the floating gate FG in the first NVM cell structure 100a and the second part FG2 of the floating gate FG in the fourth NVM cell structure 100d have a zigzag shape such that the second parts FG2 of the first and fourth NVM cell structures 100a, 100d are symmetrical to each other with respect to a center of the repeated unit 200a, but the present invention is not limited thereto. In another embodiment, the zigzag parts of the floating gates FG may be in the second and third NVM cell structures 100b, 100c, the first and third NVM cell structures 100a, 100c or the second and fourth NVM cell structures 100b, 100d.

In addition, the select gates SG of the select transistors ST can be connected in series and form a word line WL extending along the first direction D1. Also, at least one contact plug C3 is disposed on each fifth doped region 130 in each first OD region 104a, so that the fifth doped regions 130 arranged along the first direction D1 are electrically connected to the same source line SL. The third doped regions 128 farther away from the word line WL and arranged along the second direction D2 are electrically connected to the same bit line BL through contact plugs C1. The second doped regions 126 at the centers of the repeated units 200a respectively are electrically connected to the same erase line EL through contact plugs C2.

Figure 11:
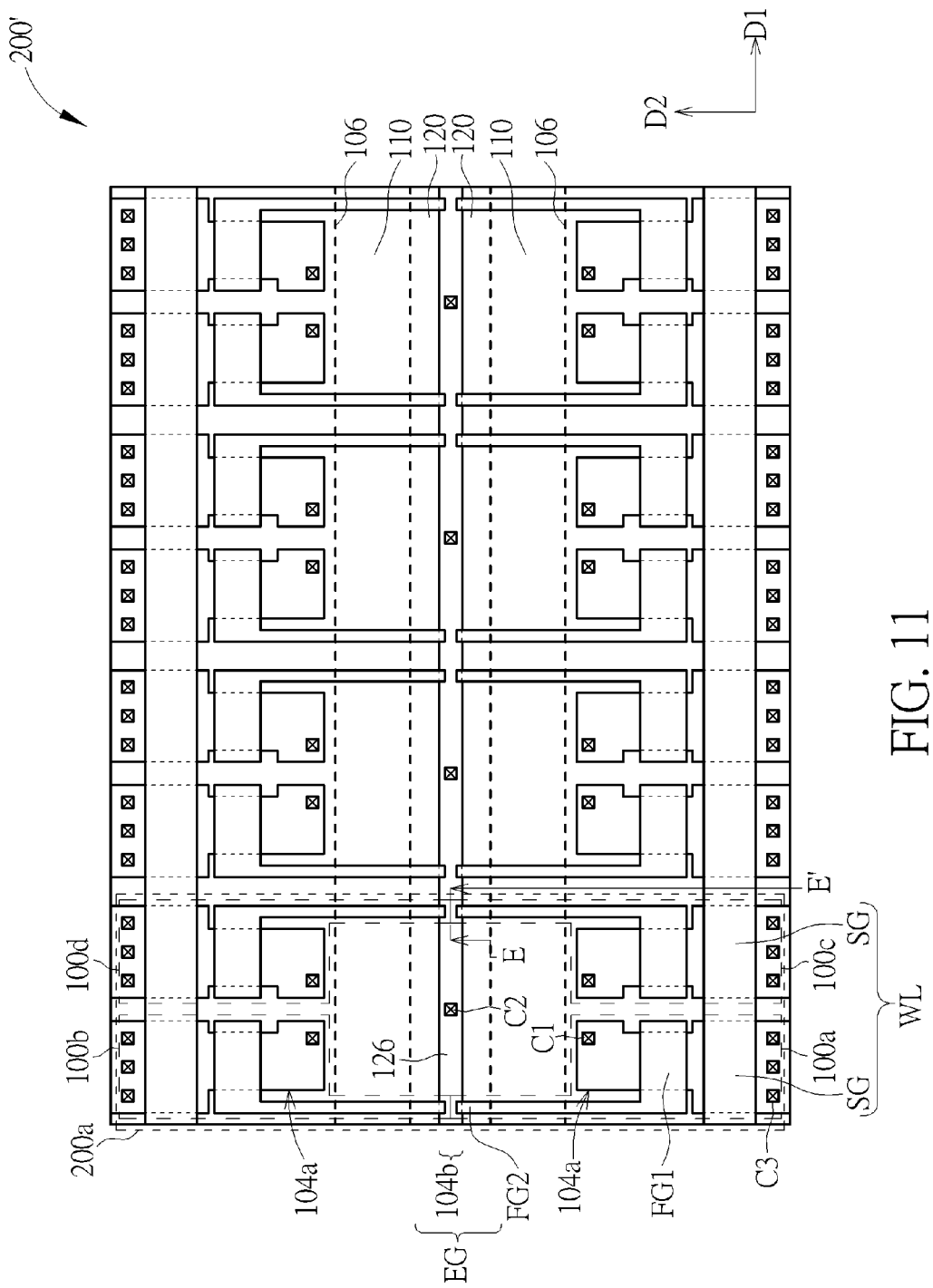
FIG. 11 is a schematic diagram illustrating a plan view of the NVM array structure according to a variant embodiment of the first embodiment of the present invention.
Figure 12:
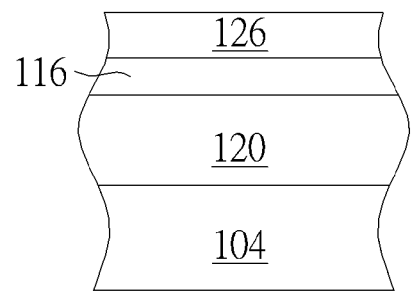
FIG. 12 illustrates a cross-sectional view taken along a cross-sectional line E-E' of FIG. 11.

Referring to FIGS. 11 and 12, FIG. 11 is a schematic diagram illustrating a plan view of the NVM array structure according to a variant embodiment of the first embodiment of the present invention, and FIG. 12 illustrates a cross-sectional view taken along a cross-sectional line E-E' of FIG. 11. As shown in FIGS. 11 and 12, as compared with the above-mentioned first embodiment, the second part FG2 of each floating gate FG in this variant embodiment may not cross the second OD region 104b and the first doped region 116. Specifically, an edge of each floating gate FG is disposed right on the second OD region 104b. Therefore the second doped region 126 may be formed by implanting by the aid of floating gate FG which is as an implant mask. Since each floating gate FG doesn't cross the second OD region 104b, the overlapping area between each floating gate FG and the first doped region 116 is reduced, and the coupling capacitance between each floating gate FG and the first doped region 116 is accordingly decreased as compared with the first embodiment. By doing so, the voltage of the floating gate FG coupled to the first well region 106 is larger, thereby increasing the difference between the erase line voltage $V_{EL}$ and the voltage of the floating gate FG during the erasing operation. Thus, the erase of the electric charges in the floating gate FG is easier, and the erase line voltage $V_{EL}$ may be reduced to increase the lifetime of the NVM array structure 200'.

The NVM cell structure and the method of fabricating the same of the present invention are not limited to the above-mentioned embodiment. The following description continues to detail the other embodiments or variant embodiments, and in order to simplify and show the difference between the other embodiments or variant embodiments and the above-mentioned embodiment, the same numerals denote the same components in the following description, and the same parts are not detailed redundantly.

Figure 13:
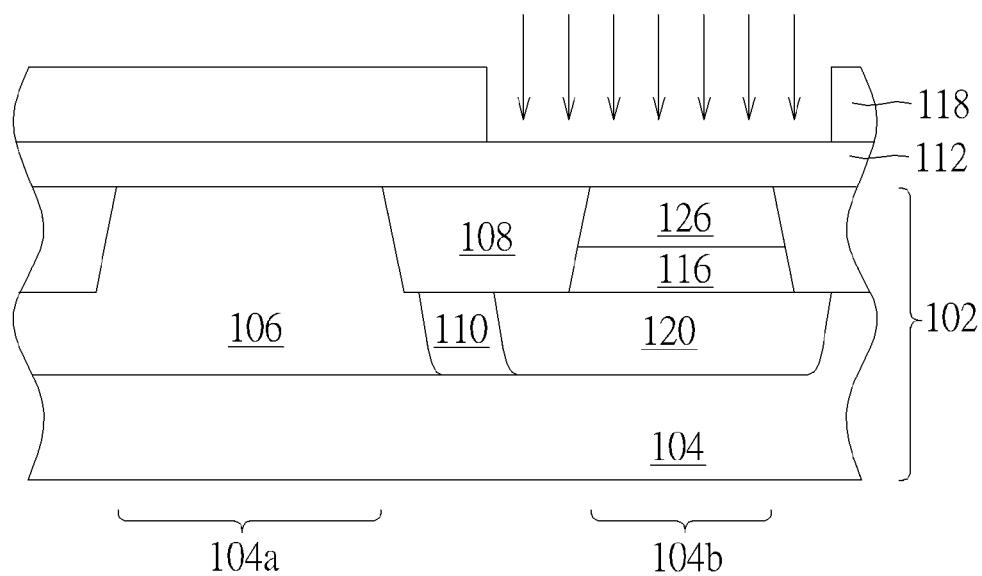
FIGS. 13 and 14 are schematic diagrams illustrating a method of fabricating a NVM cell structure according to a second embodiment of the present invention.
Figure 14:
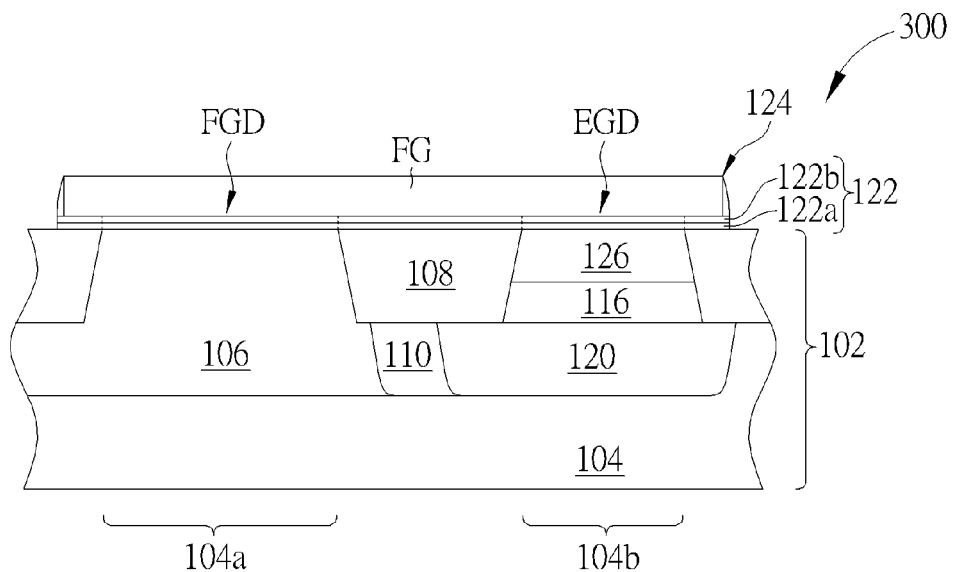

Referring to FIGS. 13 and 14, FIGS. 13 and 14 are schematic diagrams illustrating a method of fabricating a NVM cell structure according to a second embodiment of the present invention, where FIG. 14 illustrates a top view of the NVM cell structure according to the second embodiment of the present invention. As shown in FIG. 13, the step of forming second well region 120 and the steps before forming the second well region 120 in the method of fabricating the NVM cell structure 300 of this embodiment are the same as the method in the first embodiment, and are not detailed redundantly. As compared with the first embodiment, the step of forming the second doped regions 126 may be performed between forming the first doped region 116 and removing the patterned photoresist layer 118 and the sacrificial layer 112 in the method of fabricating the NVM cell structure of this embodiment. In this embodiment, after the second well region 120 is formed, an ion implantation process of the second conductivity type and a thermal drive-in process are performed through using the same patterned photoresist layer 118 as a mask to form the second doped region 126. Then, as shown in FIG. 14, the step of removing the patterned photoresist layer 118 and the sacrificial layer 112 and the steps thereafter in the method of fabricating the NVM cell structure 300 of this embodiment are the same as the method in the first embodiment and are not detailed redundantly.

Figure 15:
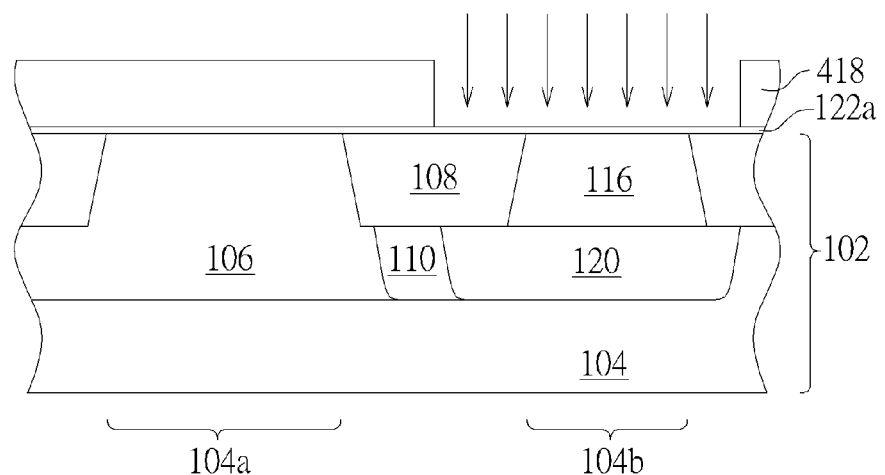
FIG. 15 is a schematic diagram illustrating a method of fabricating a NVM cell structure according to a third embodiment of the present invention.

Referring to FIG. 15 together with FIGS. 5-7, FIG. 15 is a schematic diagram illustrating a method of fabricating a NVM cell structure according to a third embodiment of the present invention. As shown in FIG. 15, the step of forming the intermediate well region 110 and the steps before forming the intermediate well region 110 in the method of fabricating the NVM cell structure of this embodiment are the same as the method in the first embodiment and are not detailed redundantly. As compared with the first embodiment, the step of removing the patterned photoresist layer 118 and the sacrificial layer 112 is performed next to the step of forming the intermediate well region 110 and followed by forming the I/O dielectric layer 122a on the first OD region 104a and the second OD region 104b in this embodiment. After that, another patterned photoresist layer 418 is formed on the I/O dielectric layer 122a, and then, by using the patterned photoresist layer 418 as a mask, the first doped region 116 is formed in the second OD region 104b and covers the second OD region 104b. Next, the second well region 120 is formed in the semiconductor substrate 104 under the first doped region 116. As shown in FIG. 5-7, after the second well region 120 is formed, the core dielectric layer 122b is formed on the I/O dielectric layer 122a, thereby forming the dielectric layer 122. Later, the poly gate including the floating gate FG is formed on the dielectric layer 122 and followed by forming the second doped regions 126 in the first doped region 116. The steps of forming the poly gate and forming the second doped regions 126 in this embodiment are the same as the first embodiment, and are not detailed redundantly.

Figure 16:
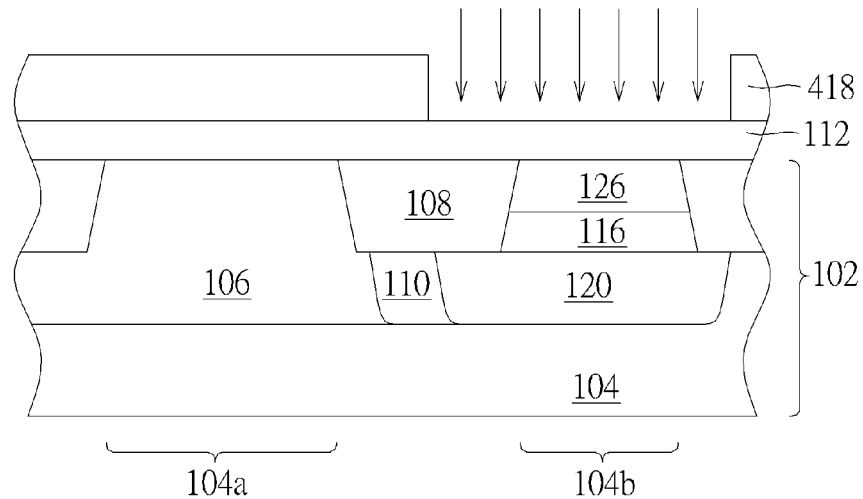
FIG. 16 is a schematic diagram illustrating a method of fabricating a NVM cell structure according to a fourth embodiment of the present invention.

Referring to FIG. 16 together with FIG. 14, FIG. 16 is a schematic diagram illustrating a method of fabricating a NVM cell structure according to a fourth embodiment of the present invention. As shown in FIG. 16, the step of forming the second well region 120 and the steps before forming the second well region 120 in the method of fabricating the NVM cell structure of this embodiment are the same as the method in the third embodiment and are not detailed redundantly. As compared with the third embodiment, the step of forming the second doped regions 126 may be performed next to the step of forming the first doped region 116 in the method of fabricating the NVM cell structure of this embodiment. In this embodiment, after the second well region 120 is formed, an ion implantation process of the second conductivity type and a thermal drive-in process are performed through using the same patterned photoresist layer 418 as a mask to form the second doped region 126. Then, the step of forming the core dielectric layer 122b and the steps after forming the core dielectric layer 122b are the same as the third embodiment and are not detailed redundantly, thereby forming the NVM cell structure that is the same as the NVM cell structure 300 of the second embodiment as shown in FIG. 14.

Figure 17:
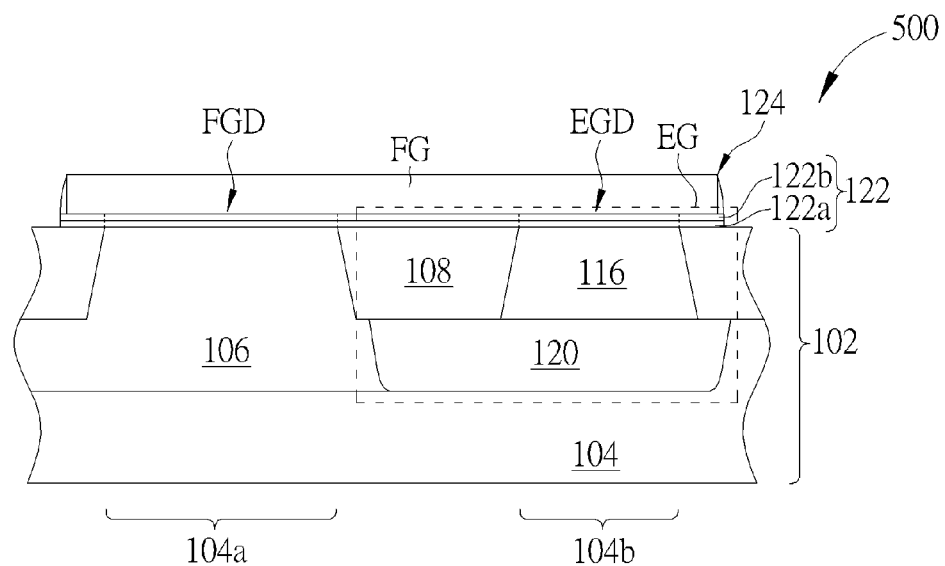
FIG. 17 is a schematic diagram illustrating a NVM cell structure according to a fifth embodiment of the present invention.

Referring to FIG. 17, FIG. 17 is a schematic diagram illustrating a NVM cell structure according to a fifth embodiment of the present invention. As shown in FIG. 17, in the NVM cell structure 500 provided by this embodiment, no intermediate well region is disposed between the first well region 106 and the second well region 120. In the method of fabricating the NVM cell structure 500 of this embodiment, the step of forming the first doped region 116 is performed next to the step of providing the substrate structure 102 and followed by forming the second well region 120. Accordingly, a side of the second well region 120 may be in contact with the first well region 106.

Figure 18:
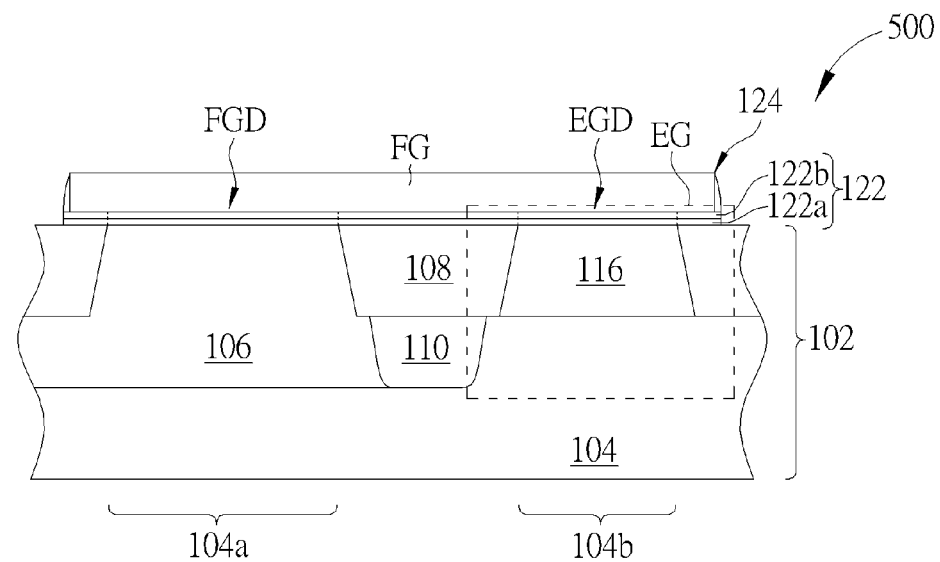
FIG. 18 is a schematic diagram illustrating a NVM cell structure according to a sixth embodiment of the present invention.

Referring to FIG. 18, FIG. 18 is a schematic diagram illustrating a NVM cell structure according to a sixth embodiment of the present invention. As shown in FIG. 18, in the NVM cell structure 600 provided by this embodiment, no second well region is formed under the first doped region 116. In the method of fabricating the NVM cell structure 600 of this embodiment, the step of removing the patterned photoresist layer 118 and the sacrificial layer 112 and the step of forming the dielectric layer 122 is performed next to the step of forming the first doped region 116. Accordingly, a bottom of the first doped region 116 and a side of the intermediate well region 110 may be in contact with the semiconductor substrate 104 between them. In order to avoid the horizontal junction breakdown between the first well region 120 and the erase gate region EG during the programming operation, a width of the intermediate well region 110 or a width of the isolation structure 108 between the first well region 106 and the erase gate region EG in this embodiment may be larger than a width of the intermediate well region 110 and the width of the isolation structure 108 between the first well region 106 and the erase gate region EG in the first embodiment.

Figure 19:
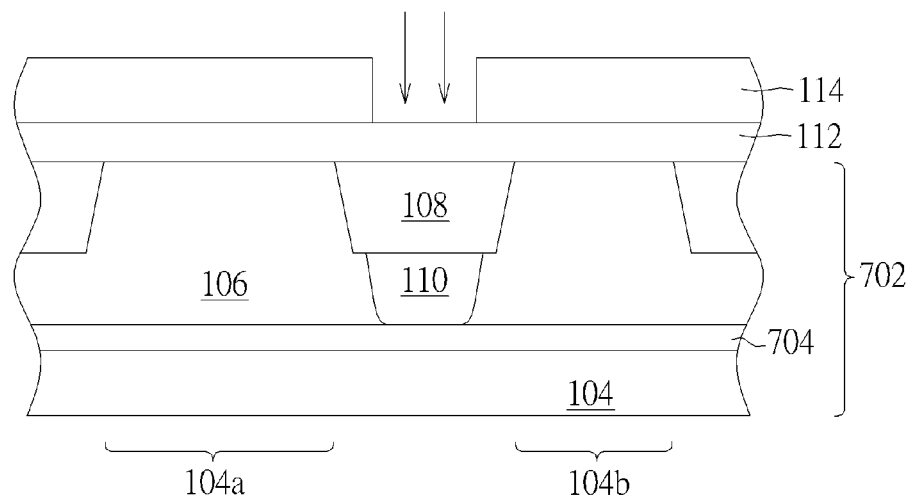
FIGS. 19 and 20 are schematic diagrams illustrating a method of fabricating a NVM cell structure according to a seventh embodiment of the present invention.
Figure 20:
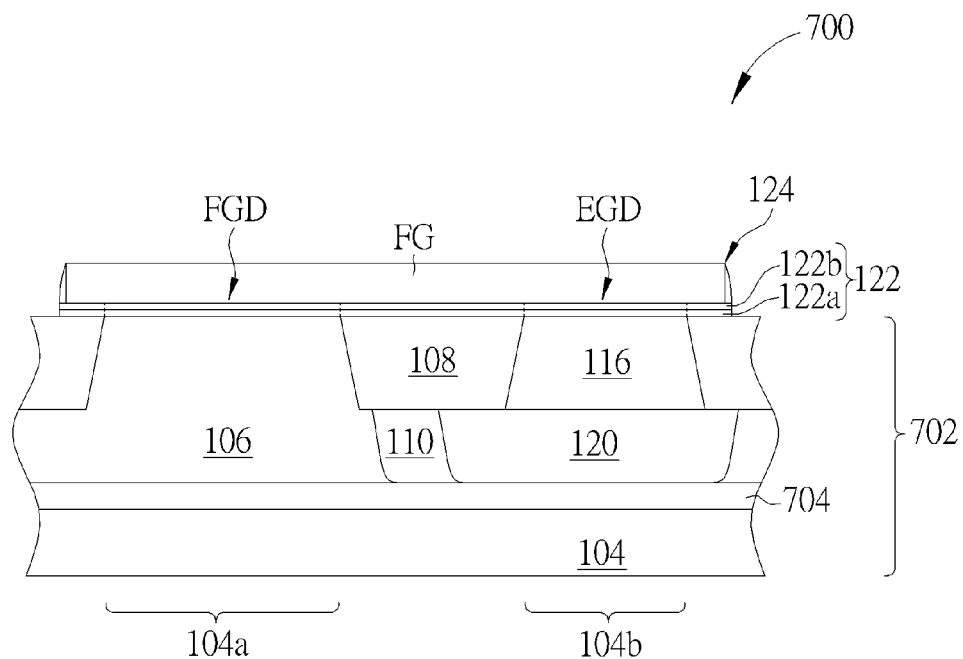
Figure 21:
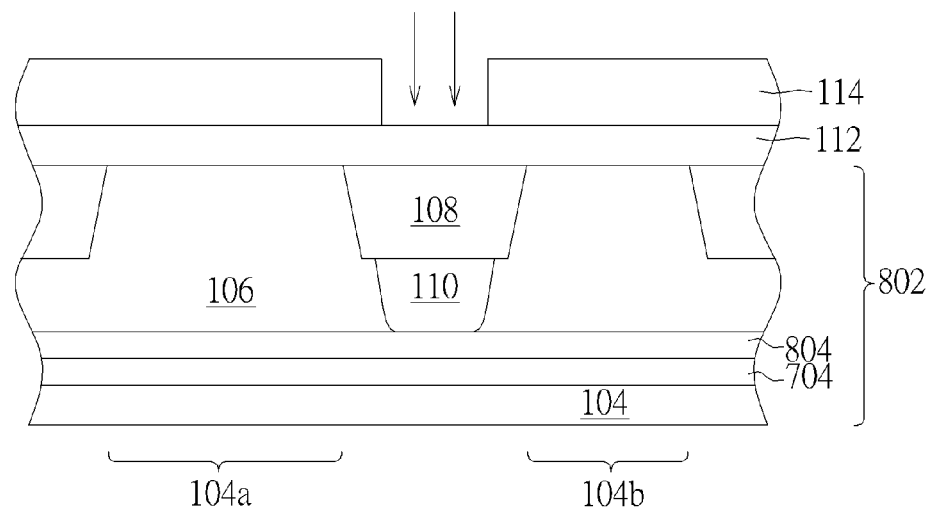
FIGS. 21 and 22 are schematic diagrams illustrating a method of fabricating a NVM cell structure according to an eighth embodiment of the present invention.

Referring FIGS. 19 and 20, FIGS. 19 and 20 are schematic diagrams illustrating a method of fabricating a NVM cell structure according to a seventh embodiment of the present invention, where FIG. 20 is a schematic diagram illustrating a cross-sectional view of the NVM cell structure according the seventh embodiment of the present invention. As shown in FIG. 19, as compared with the first embodiment, the step of providing the substrate structure 702 further includes providing a first deep well region 704 in the semiconductor substrate 104 under the first well region 106, and the first deep well region 704 has the second conductivity type. As shown in FIG. 21, the steps after providing the substrate structure 702 of this embodiment are the same as the method of the first embodiment as shown in FIGS. 2-4 or the method of the third embodiment as shown in FIG. 16, and are not redundantly detailed. In NVM cell structure 700 of this embodiment, the first deep well region 704 is disposed under the first well region 106, the intermediate well region 110 and the second well region 120 and used to electrically insulate the NVM cell structure 700 from other devices formed in the same semiconductor substrate 104.

Figure 22:
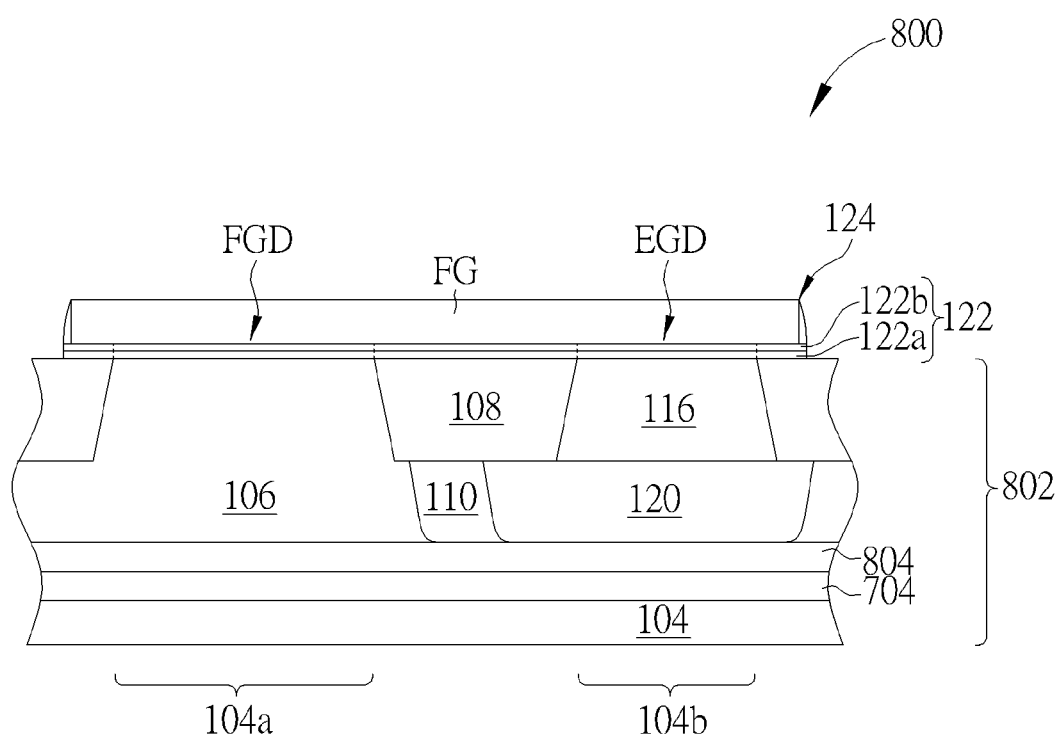

Referring FIGS. 21 and 22, FIGS. 21 and 22 are schematic diagrams illustrating a method of fabricating a NVM cell structure according to an eighth embodiment of the present invention, where FIG. 22 is a schematic diagram illustrating a cross-sectional view of the NVM cell structure according the eighth embodiment of the present invention. As shown in FIG. 21, as compared with the seventh embodiment, the step of providing the substrate structure 802 further includes providing a second deep well region 804 in the semiconductor substrate 104 between the first well region 106 and the first deep well region 704, and the second deep well region 804 has the first conductivity type. In this embodiment, a doping concentration of the second deep well region 804 is larger than the doping concentration of the semiconductor substrate 104 and less than the doping concentration of the intermediate well region 110. As shown in FIG. 22, the steps after providing the substrate structure 802 of this embodiment are the same as the method of the sixth embodiment, and are not redundantly detailed. In the NVM cell structure 800 of this embodiment, besides between the first well region 106 and the first deep well region 704, the second deep well region 804 is also disposed between the first doped region 116 and the first deep well region 704, such that the vertical junction breakdown between the first doped region 116 and the first deep well region 704 can be prevented, and the NVM cell structure 800 without the second well region 120 disposed between the first doped region 116 and the first deep well region 704 still can tolerate the high voltage applied to the second doped region 126 during the erasing operation. In another embodiment, the steps after providing the substrate structure 802 may be the same as the method of the first embodiment or the method of the third embodiment, so that the NVM cell structure 800 may include the second well region 120 between first doped region 116 and the second deep well region 804. The doping concentration of the second deep well region 804 may be substantially the same as the doping concentration of the second well region 120, but not limited herein.

From the above description, in the NVM cell structure of the present invention, the electric charges Q can be electrically programmed to the floating gate and electrically erased from the floating gate, so that the NVM cell structure can be multi-time programmable (MTP) and be an electrically erasable programmable (EEP) NVM. Furthermore, since the first doped region having lower doping concentration than the second doped region is disposed to encompass the second doped region and the second well region having the doping concentration larger than that of the semiconductor substrate and less than that of the intermediate well region is disposed between the second doped regions and the first well region, the stronger PN junction may be formed between the erase capacitor and the first well region coupled to the channel region of the floating gate transistor, and the junction breakdown voltage between the second doped regions and the first well region can be increased while applying a large voltage difference between the second doped regions and the first well region in the erasing operation, thereby increasing cycling times of the programming operations and the erasing operations and a lifetime of the NVM cell structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A non-volatile memory (NVM) cell structure, comprising:
a semiconductor substrate having a first conductivity type, and the substrate has a first oxide define (OD) region and a second OD region separated from each other;
a first well region disposed in the first OD region of the semiconductor substrate, wherein the first well region has a second conductivity type;
a floating gate transistor on the first well region, wherein the floating gate transistor comprises a floating gate and a floating gate dielectric layer disposed between the floating gate and the first well region, and the floating gate comprises a first part overlapping the first OD region and a second part overlapping the second OD region; and
an erase gate region on the second OD region, wherein the erase gate region comprises a first doped region disposed in the second OD region and covering the second OD region, two second doped regions disposed in the first doped region, and an erase gate dielectric layer between the first doped region and the second part of the floating gate, wherein the first doped region and each second doped region have the second conductivity type, and a doping concentration of each second doped region is larger than a doping concentration of the first doped region, and wherein the second doped regions are disposed at two sides of the second part of the floating gate, and a combination of the second doped regions and the second part of the floating gate totally covers the first doped region.

2. The NVM cell structure according to claim 1, further comprising an isolation structure, disposed in the semiconductor substrate, and the isolation structure defining the first OD region and the second OD region.

3. The NVM cell structure according to claim 1, wherein the erase gate region further comprises a second well region, disposed in the semiconductor substrate under the first doped region, and a top of the second well region being in direct contact with the first doped region, wherein the second well region has the first conductivity type, and a doping concentration of the second well region is larger than a doping concentration of the semiconductor substrate.

4. The NVM cell structure according to claim 3, further comprising an intermediate well region, disposed in the semiconductor substrate between the first OD region and the second OD region, and two sides of the intermediate well region being in direct contact with the first well region and the second well region respectively, wherein the intermediate well region has the first conductivity type, and a doping concentration of the intermediate well region is larger than the doping concentration of the second well region.

5. The NVM cell structure according to claim 3, further comprising a first deep well region, disposed in the semiconductor substrate under the first well region and the second well region, wherein the first deep well region has the second conductivity type.

6. The NVM cell structure according to claim 5, further comprising a second deep well region, disposed in the semiconductor substrate between the first well region and the first deep well region and between the second well region and the first deep well region, wherein the second deep well region has the first conductivity type, and a doping concentration of the second deep well region is larger than the doping concentration of the semiconductor substrate.

7. The NVM cell structure according to claim 1, further comprising an intermediate well region, disposed in the semiconductor substrate between the first OD region and the second OD region, and the intermediate well region being in direct contact with the first well region, wherein a doping concentration of the intermediate well region is larger than a doping concentration of the semiconductor substrate.

8. The NVM cell structure according to claim 7, further comprising a first deep well region and a second deep well region, disposed in the semiconductor substrate under the first well region, and the second deep well region being disposed between the first well region and the first deep well region and between the intermediate well region and the first deep well region, wherein the first deep well region has the second conductivity type, the second deep well region has the first conductivity type, and a doping concentration of the second deep well region is larger than the doping concentration of the semiconductor substrate.

9. The NVM cell structure according to claim 1, wherein an overlapping area between the floating gate and the first OD region is larger than an overlapping area between the floating gate and the second OD region.

10. The NVM cell structure according to claim 1, wherein the floating gate crosses the first doped region.

11. The NVM cell structure according to claim 1, wherein an edge of the floating gate is disposed right on the first doped region.

12. The NVM cell structure according to claim 1, wherein the floating gate transistor further comprising a third doped region and a fourth doped region disposed in the first well region at two sides of the floating gate, wherein the third doped region and the fourth doped region both have the first conductivity type.

13. The NVM cell structure according to claim 12, further comprising a select transistor disposed on the first OD region and electrically connected to the floating gate transistor in series through the fourth doped region.

14. The NVM cell structure according to claim 1, wherein the first conductivity type is p-type, and the second conductivity type is n-type.

* * * * *